US006349005B1

United States Patent
Schuster et al.

(10) Patent No.: US 6,349,005 B1
(45) Date of Patent: Feb. 19, 2002

(54) MICROLITHOGRAPHIC REDUCTION OBJECTIVE, PROJECTION EXPOSURE EQUIPMENT AND PROCESS

(75) Inventors: Karl-Heinz Schuster, Königsbronn; Helmut Beierl, Heindenheim, both of (DE)

(73) Assignee: Carl-Zeiss-Stiftung (DE)

(*) Notice: Subject to any disclaimer, the term of this patent is extended or adjusted under 35 U.S.C. 154(b) by 0 days.

(21) Appl. No.: 09/416,105

(22) Filed: Oct. 12, 1999

(30) Foreign Application Priority Data

Nov. 30, 1998 (DE) .......................... 198 55 108

(51) Int. Cl.[7] .............. G02B 9/60; G02B 9/64
(52) U.S. Cl. ............... 359/754; 359/649; 359/766
(58) Field of Search ..................... 359/754, 755, 359/756, 763, 766, 648, 649

(56) References Cited

U.S. PATENT DOCUMENTS

| 5,105,075 A | 4/1992 | Ohta et al. |
| 5,260,832 A | 11/1993 | Togino et al. |
| 5,343,489 A | 8/1994 | Wangler |
| 5,675,401 A | 10/1997 | Wangler et al. |
| 5,781,278 A | 7/1998 | Matsuzawa et al. |
| 5,920,379 A | * 7/1999 | Matsuyama ............ 359/766 |

FOREIGN PATENT DOCUMENTS

| DE | DD 299 017 A7 | 2/1988 |
| EP | 0 712 019 A2 | 5/1996 |
| EP | 0 717 299 A1 | 6/1996 |
| EP | 0 721 150 A2 | 7/1996 |
| EP | 0 732 065 A2 | 9/1996 |
| EP | 0742 492 A1 | 11/1996 |
| EP | 747 772 A1 | 12/1996 |
| EP | 0 770 895 A2 | 5/1997 |
| EP | 0 828 172 A1 | 3/1998 |
| RU | SU 1659955 A1 | 7/1989 |

OTHER PUBLICATIONS

Optical Lithography—30 years and 3 orders magnitude. Bruning. Fairport, NY; pp. 14–27.

New Lenses for Microlithography. Gfatzel. Oberkochen, Germany; pp. 310–320.

* cited by examiner

*Primary Examiner*—Scott J. Sugarman

(57) ABSTRACT

A microlithographic projection objective with a lens arrangement, has a a first lens group of positive refractive power, a second lens group of negative refractive power, a third lens group of positive refractive power, a fourth lens group of negative refractive power, and a fifth lens group of positive refractive power. The system diaphragm (AS) is situated in the fifth lens group, and at least two lenses of this lens group are situated before the system diaphragm (AS). The numerical aperture on the image side is greater than 0.65 (in examples, up to 0.8), or this lens group has at least 13 lenses, or the system diaphragm (AS) is arranged in the region of the lens at which the pencil of rays assumes the greatest diameter, and its two adjacent lenses.

29 Claims, 7 Drawing Sheets

US 6,349,005 B1

MICROLITHOGRAPHIC REDUCTION OBJECTIVE, PROJECTION EXPOSURE EQUIPMENT AND PROCESS

CROSS-REFERENCES TO RELATED APPLICATIONS

Not applicable

STATEMENT REGARDING FEDERALLY SPONSORED RESEARCH OR DEVELOPMENT

Not applicable

BACKGROUND OF THE INVENTION

1. Field of the Invention

This invention relates to a microlithographic reduction objective, and more particularly to a purely refractive high power objective, as is required for high resolution microlithography, particularly in the DUV wavelength region.

2. Discussion of Relevant Art

Such refractive objectives with two beam waists have already been described in the article by E. Glatzel, "New Lenses for Microlithography", SPIE, Vol. 237, 310 (1980), and have been constantly developed since then. Objectives of the category concerned, of the Carl Zeiss Company, are sold in PAS wafer steppers and wafer scanners of the ASML Company, Holland.

Such an objective made by the Tropel Company in 1991 is shown in FIG. 16 of J. H. Bruning, "Optical Lithography—Thirty years and three orders of magnitude", SPIE, Vol. 3049, 14–27 (1997). Numerous variants of projection objectives of the category concerned are found in patent applications, such as European Patent applications EP 0 712 019-A (U.S. application Ser. No.08/337,647 of Nov. 10, 1994), EP 0 717 299-A, EP 0 721 150-A, EP 0 732 605-A, EP 0 770 895-A (U.S. Pat. No. 5,781,278), and EP 0 828 172-A.

Similar objectives with a somewhat smaller numerical aperture are also found in Russian Patent SU 1 659 955-A, EP 0 742 492-A (FIG. 3), U.S. Pat. No. 5,105,075 (FIGS. 2 and 4), U.S. Pat. No. 5,260,832 (FIG. 9) and German Patent DD 299,017-A.

SUMMARY OF THE INVENTION

The present invention has as its object to provide a type of objective which, in the context of the present state of the art, is outstanding for its high resolution with a large image field and small overall length, and its correction of imaging errors, particularly as regards distortion, remains stable even with different kinds of illumination (different degrees of coherence, etc.) and with significant stopping down (for exposure with large depth of focus region).

The object is attained with a microlithographic projection objective with a lens arrangement, having a first lens group (LG1) of positive power, a second lens group (LG2) of negative refractive power, a third lens group (LG3) of positive refractive power, a fourth lens group (LG4) of positive refractive power, and a fifth lens group (LG5) of positive refractive power. The numerical aperture on the image side is greater than 0.65, preferably 0.68. A system diaphragm (AS) is situated in said fifth lens group (LG5). And, at least two lenses of said fifth lens group (LG5) are situated before said system diaphragm (AS).

It is advantageous that said fifth lens group (LG5) has at least 13 lenses (L18–L31).

It is also advantageous that the first lens group (LG1) of positive refractive power forms a convexity (B1) of a pencil of rays, the second lens group (LG2) of negative refractive power forms a waist (T1) of said pencil of rays, the third lens group (LG3) of positive refractive power forms a second convexity (B2) of said pencil of rays, the fourth lens group (LG4) of negative refractive power forms a second waist (T2) of said pencil of rays, and the fifth lens group (LG5) of positive refractive power forms a third convexity (B3) of said pencil of rays.

The system diaphragm (AS) is in a region of a lens (L22) at which said pencil of rays assumes its greatest diameter and its two neighboring lenses (L21, L23).

The diaphragm is placed in the fifth lens group in the region of the third convexity of the pencil of rays. This fifth lens group and the incorporation of the system diaphragm altogether has more importance. The attention paid partially in the state of the art to the configuration of the waists, especially the first, is then quite unimportant, as the embodiments show.

The high numerical aperture as the primary means for attaining high resolution strains the design, essentially between the system diaphragm and the image plane, particularly when the overall length and the lens diameter have to remain small in some degree, which is strongly preferred, particularly for easy integration into an existing design of a projection exposure equipment and for production, and also on grounds of cost.

A particularly advantageous capability of stopping the objective down, which is attained by respective independent minimizing of the various image errors is made possible by the design conception of the invention. This is in contrast to a fixed aperture objective, in which various large errors can be subtractively averaged out. The advantage is that the user can optimize the trade-off of resolution and depth of focus, respectively in relation to the case of application.

The production process according to the invention makes use of the outstanding correction of the objective by flexible illumination setting and aperture setting with different successive exposures in the production process. The individual exposures can in this case take place with different masks in a single projection exposure equipment, or several projection exposure equipments according to the invention, or also in combination with others, can be used in a production line.

BRIEF DESCRIPTION OF THE DRAWINGS

The invention will be described in detail with reference to the accompanying drawings, in which.

DETAILED DESCRIPTION OF PREFERRED EMBODIMENTS

Figure 1:
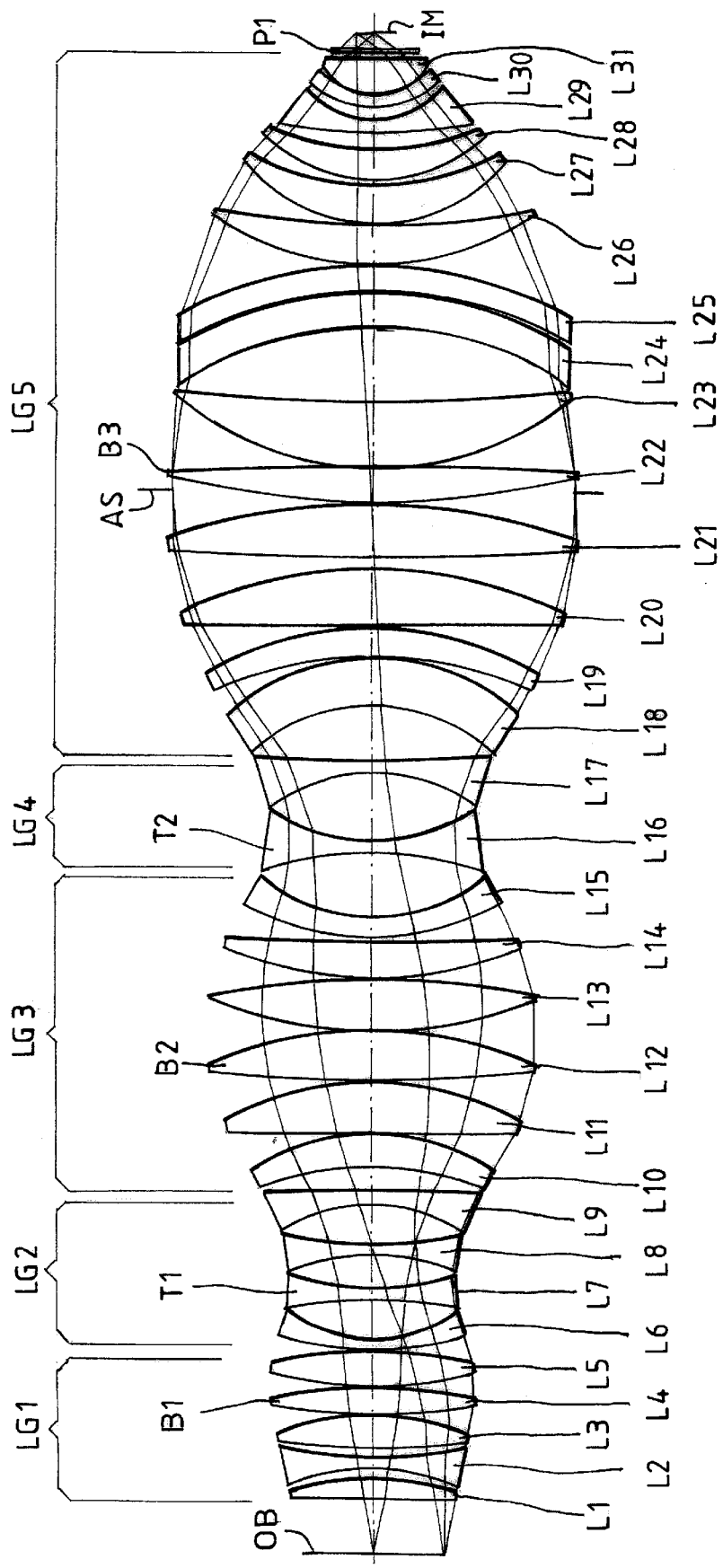
FIG. 1 shows the lens section of a first embodiment.

Corresponding to the primary requirement for a projection objective according to the invention, the examples of FIGS. 1–3 and 6 are designed for operation with an excimer laser of 248.38 nm wavelength as is usual in microlithography, and exclusively contain quartz glass lenses. Their focal length is 1,000 mm for FIGS. 2, 3 and 6, to 1,150 mm for FIG. 1, at the lower end of what can be used and made. The numerical aperture of 0.70 (in FIGS. 2, 3 and 6) and 0.80 in FIG. 1 is clearly above the prior art, and shows the potentiality of the design according to the invention and makes microlithography possible with resolutions down to 0.18 μm and less, under mass production conditions. Such resolutions are considered to be only just short of what is completely unattainable by optical lithography.

Thus with an image height $2Y_B=27.2$ mm, there results at NA=0.70 the very high light guide value of $LLW=NA \cdot 2Y_B=19.04$. The objective is thus suitable for a scanner with an image field of 8×26 mm².

It is noteworthy here that the increase of the image-side numerical aperture from 0.63 just to the value of 0.70 which was reached (FIGS. 2, 3, 6) is considerably more difficult than, say, the increase from 0.45 to 0.6, since as is known, all the image errors reach a pole at NA=1.0 in air; they correspondingly rise increasingly steeply while approaching this value, and are increasingly more difficult to correct. The example of FIG. 1 thus shows, with NA=0.8, an outstanding construction.

The lens data of the embodiment according to FIG. 1 are given in Table 1. There are provided 31 lenses L1–L31 and a flat plate P1. P1 serves as an easily changeable closure window on the wafer side.

The RMS error attained of under 13 mλ over all image heights shows an outstanding imaging performance.

Lenses L1–L5 form a first lens group LG1 with the first convexity B1 of the light pencil at the back face of lens L4. A negative lens L2 provides the required beam widening.

The lens group LG2, consisting of the negative lenses L6–L9, forms the first waist T1 at the back surface of the lens L7. Typical for this lens group LG2 are the meniscus lenses L6 and L9, concave toward the waist.

The third lens group LG3 consists of the five positive lenses L10–L14, the outer lenses L10 and L14 respectively being constituted on the outside as concave meniscuses, and comprises also the meniscus L15, concave toward the negative image side. The second convexity B2 with the locally maximum light pencil diameter is formed at the back surface of the lens L12.

The fourth lens group LG4 consists of two negative lenses L16 and L17. The second waist T2 is formed at the back surface of the lens L16. Here a strongly biconcave air lens is formed.

The fifth lens group LG5 with the 14 lenses L18–L31 is the most important for the objective according to the invention.

The system diaphragm AS is arranged in front of the lens L22. The third convexity B3 is formed at the front surface of the following lens L22, with its light pencil diameter (308.0 mm) only slightly larger in comparison with the diaphragm diameter (306.3 mm).

According to the invention, the beam deflection in the region of the convexity B3 takes place by means of numerous positive lenses L19–L23, which are moderately strong and thus considerably thin, and are arranged on both sides of the diaphragm AS. The spherical under-correction in this region is thereby minimized, and at the same time the overall length is reduced by the use of fewer, but stronger and thicker, lenses.

The variation of the image errors on stopping down or with different illumination settings is also reduced by these measures. Of the two lenses L19 and L20 which are in the divergent beam path, the latter has the greater refractive power. The lenses L21 and L22 have evenly distributed refractive power, and the beam path between the two lenses is nearly parallel. Lenses L21–L23 take over a considerable portion of the system refractive power with the smallest possible production of spherical overcorrection, and relax the problem of the dependence of the error correction on the numerical aperture and kind of illumination (NA-sigma problem). Thus outstanding imaging properties can be attained at the most varied illumination settings and aperture settings.

The first lens L18 of the fifth lens group LG5 is a weakly refractive, thick meniscus, concave toward the object side. A division here by a spherically over-correcting air lens would in fact relax correction action of the following lenses, but would disadvantageously increase the overall length.

The lens L24 substantially forms, with the following biconvex lens L25 separated only by a thin air gap, a weakly refracting thick meniscus. By spherical overcorrection, it balances the corresponding action of the preceding lenses L18–L23. The splitting into two parts, L24 and L25, here again brings about the shortest overall length. They are the only lenses on the image side of the system diaphragm AS which are concave toward the object.

The exactly reversed advantage of thick lens L18 and split meniscus L24, L25 is made clear from the different surroundings and working regions of the meniscuses. L18, little loaded, is in the divergent beam path. All rays pass, substantially normal, through the lens surfaces. The meniscus L18 acts principally as a Petzval element and presses the Petzval sum of the objective. This function can be distributed around, however, so that the thickness can be reduced.

In contrast to this, the split meniscus L24, L25 is in the convergent beam path and under medium to heavy loading. It takes over alone the task of spherical over-correction of the immediate surroundings. In a one-part embodiment, this requires a considerable thickness. The splitting of the meniscus by means of an air space which is little loaded provides the decoupling of meniscus radius and meniscus thickness. The two lenses L24, L25 can thereby be set to a small thickness, and the total thickness can be reduced.

The two negative meniscuses L29 and L30, with the closing collecting lens L31, are also, in some cases in the literature, termed the sixth lens group.

The correction of the sagittal oblique spherical aberration brings particular problems on increasing the aperture. These problems are already mitigated by the above-mentioned measures in the diaphragm region, but are not solved. In the field-effective region between the diaphragm AS and the image IM, an increase of the individual refractive power of plus lenses (L26, L27, L28, L31) and minus lenses (L29, L30) is provided for the correction of the sagittal oblique spherical aberration. The means of choice is then the correction by the compensation of image errors of higher order. This is of course responsible for the relatively large diameter of the lenses L19–L25 in the diaphragm space. The refractive power of the negative lens L29 is thus high; three preceding positive lenses L26–L28 permit the divided provision of the corresponding positive refractive power. By means of the large free space with three lenses as regard the curvature of the lenses, it is possible to keep the sine i angle of the coma rays here respectively under the value of the high numerical aperture of 0.80.

The strong curvature of the negative meniscus results in spherically over-correcting air spaces before and behind it.

The correction of the image errors outside the main sections is made considerably more difficult by the increased aperture. To correct it, the adjustment of the refractive power in the third lens group LG3 is optimized in the region of the second convexity B2. The lens pair L14 and L15 deflects the pencil of rays in the second waist T2 and thereby creates a favorable contribution to the Petzval correction in a space-saving manner, just as for the lens L18. The positive lenses L10–L13 of the third lens group LG3 and the negative lens group LG4 are thereby relieved of refractive power.

The positive refractive power of L14 improves the image errors considered in the 45° section through the aperture. By the negative refractive power of L15, the negative fourth lens group LG4, with the spherically over-correcting lenses L16 and L17, is relieved, so that zone errors are reduced in aperture and field.

Two single lenses L14, L15 are clearly to be preferred to one thick meniscus; firstly, as illustrated, the image error correction can be considerably improved, and secondly, the cooling of the lenses is improved, which is a problem known as "lens heating" (particularly at 193 nm) with the non-negligible absorption at high radiated power, in the slit-shaped field of scanners.

These features can also be correspondingly found in the following embodiments.

Figure 2:
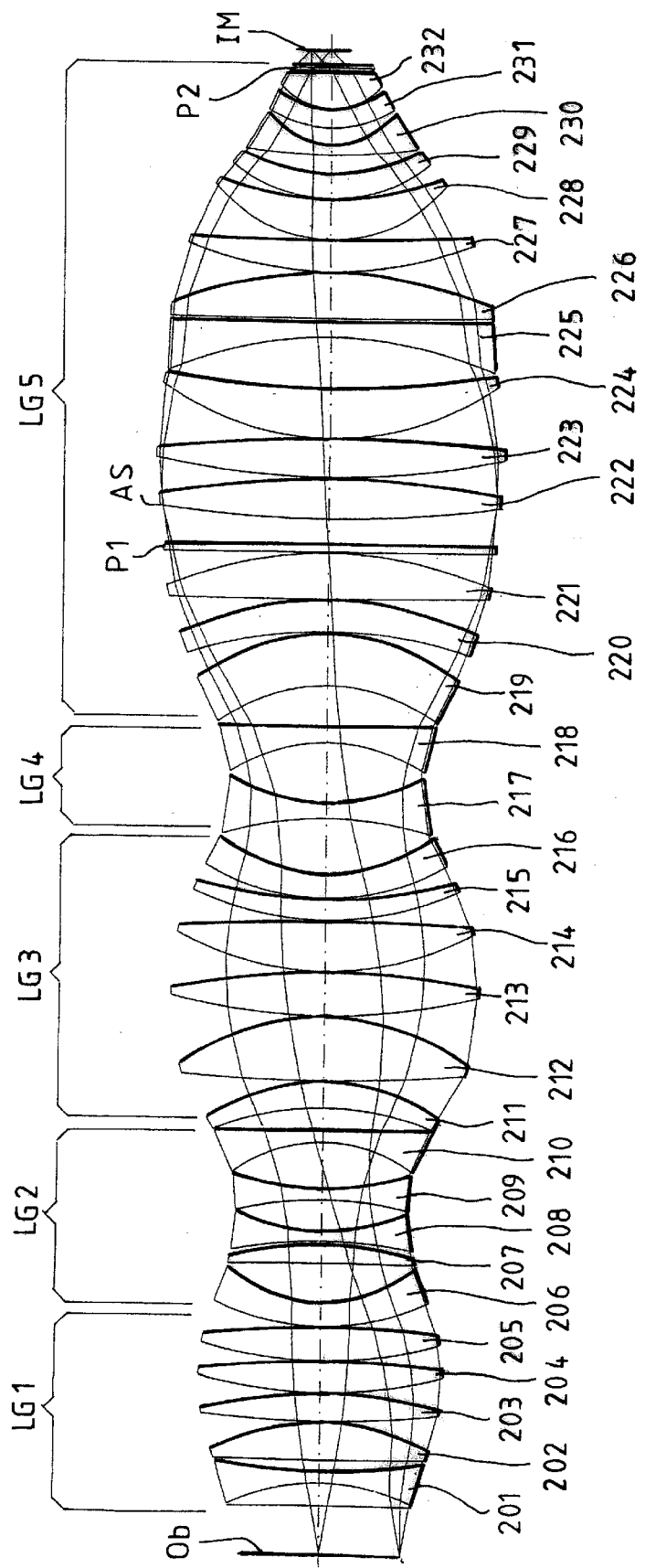
FIG. 2 shows the lens section of a second embodiment.
Figure 3:
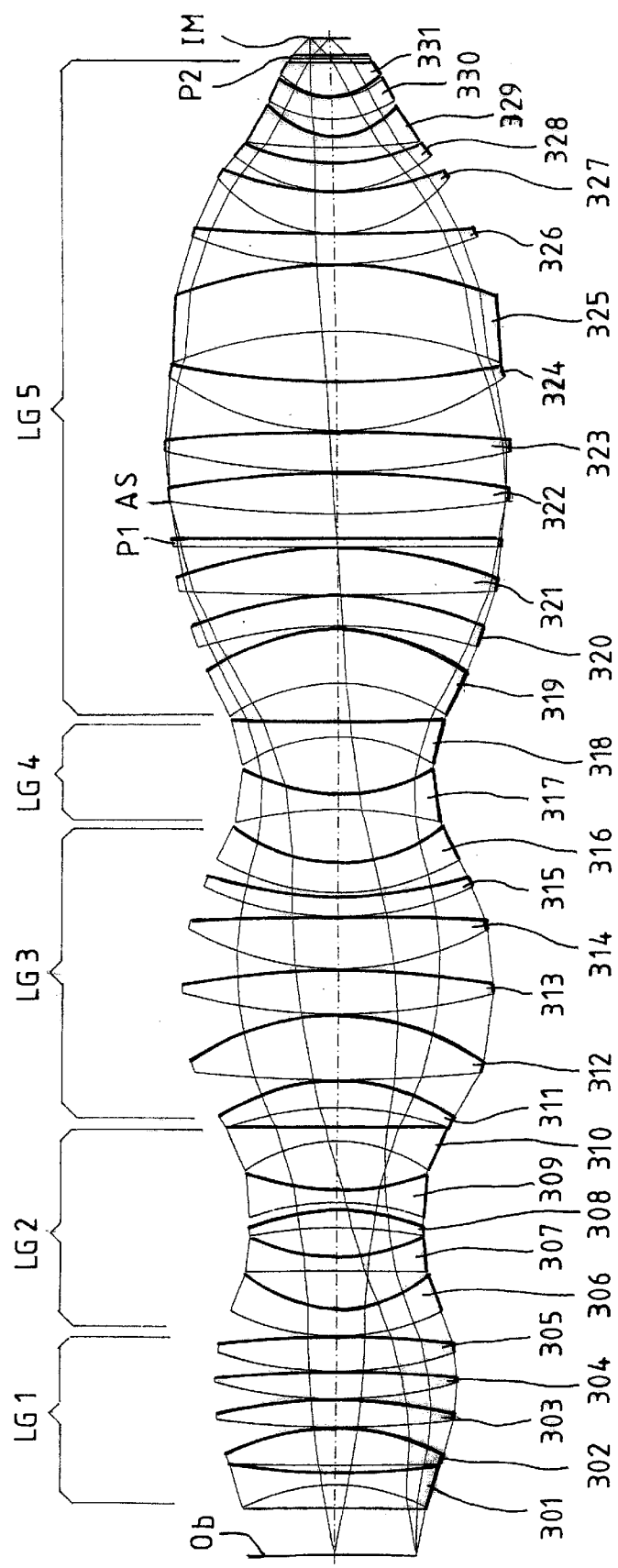
FIG. 3 shows the lens section of a third embodiment.
Figure 6:
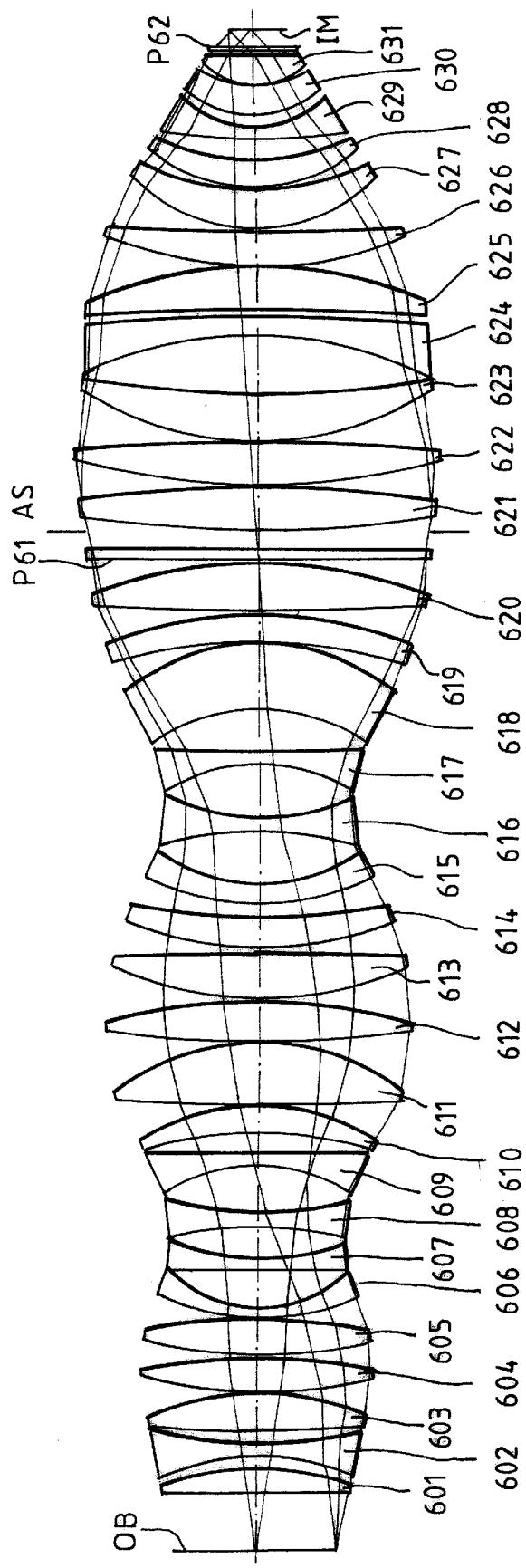
FIG. 6 shows the lens section of a fourth embodiment.

The further embodiments of FIGS. 2 and 3, and also FIG. 6, are embodied at moderately high aperture NA=0.7. The focal lengths are then reduced to 1,000 mm. The second embodiment according to FIG. 2 and Table 2 shows that the design is exceptionally stable against changes in the first two lens groups LG1 and LG2. In the first lens group LG1, the first two lenses 201 and 202 have changed places as compared with FIG. 1. In the second lens group LG2, a positive lens 207 has been inserted between the negative lenses 206 and 208–210. The constitution of this lens group LG2 with or without positive lens is often shown as important in the prior art, e.g., EP 0 770 895-A (without) and EP 0 717 299-A (with).

The fifth lens group in particular shows the same qualitative features, but the lens diameters are substantially reduced by the reduced aperture.

In contrast to the meniscus pair L24/L25, the thin air gap is clearly less curved for the lenses 225, 226. The main effect of spherical over-correction described for L24/L25 of FIG. 1 is still retained here.

The third embodiment according to FIG. 3 and Table 3 shows the first lens group as in the second embodiment. The second lens group shows the positive lens 308 now moved into the middle, between the two respective pairs of negative lenses 306, 307 and 309, 310.

The fifth lens group is now reduced by 1 lens to 13 lenses by combining lenses L24 and L25 of FIG. 1 to the thick meniscus 325. Equally good imaging performance is possible with this arrangement as with the division of the meniscus into two lenses L24 and L25.

In both embodiments of FIGS. 2 and 3 an additional flat plate P1 is provided near the diaphragm, apart from the closure flat plate P2. This plate P1 can be used as an apodization filter, for example.

Figure 4A:
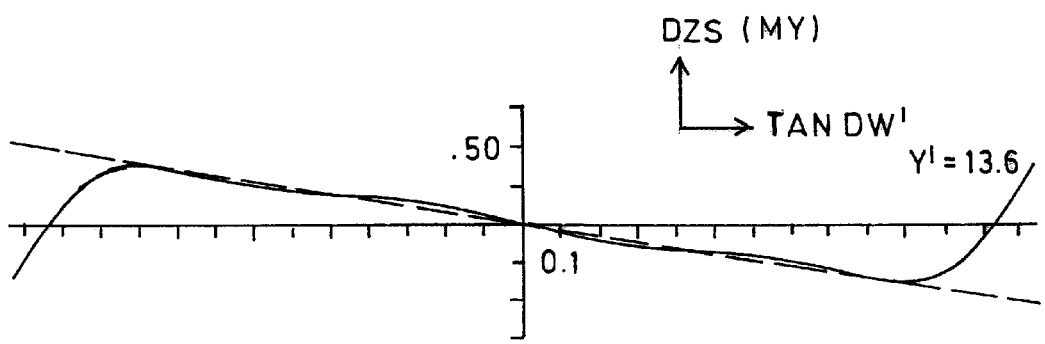
FIGS. 4a–c show the transverse aberrations in sagittal section for different image heights in FIG. 1.
Figure 4B:
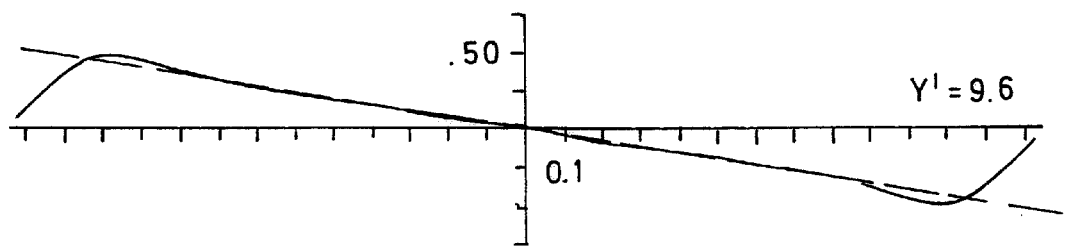
Figure 4C:
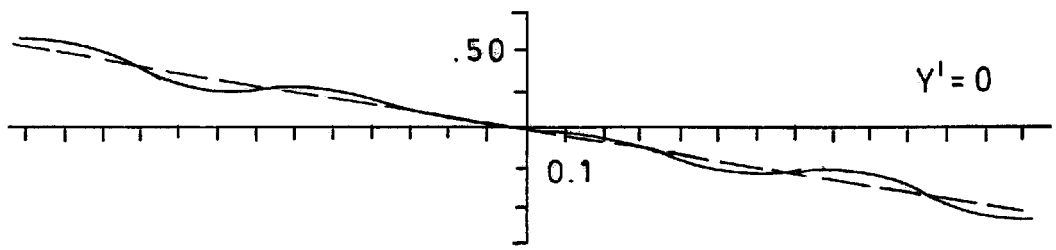
Figure 5A:
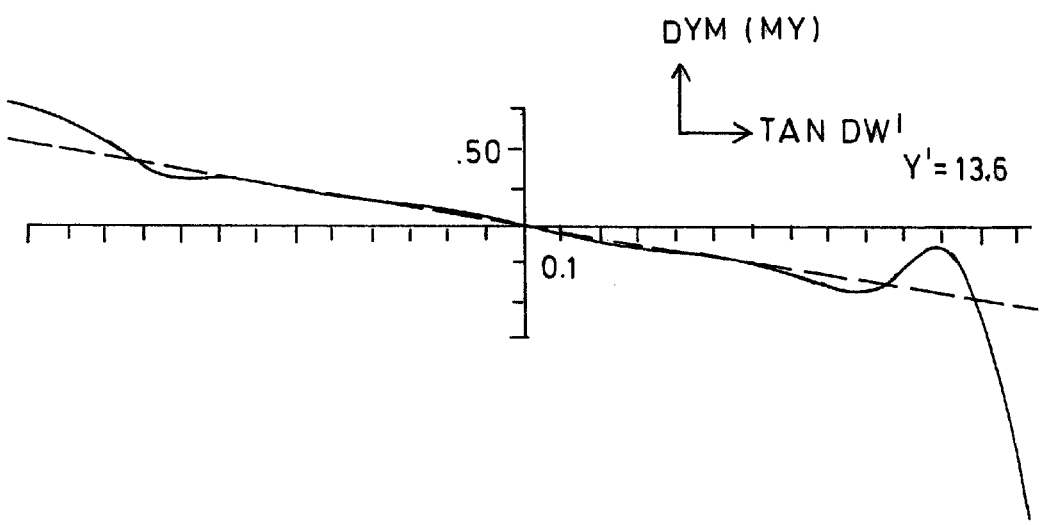
FIGS. 5a—c show the transverse aberrations in meridional section for different image heights in FIG. 1.
Figure 5B:
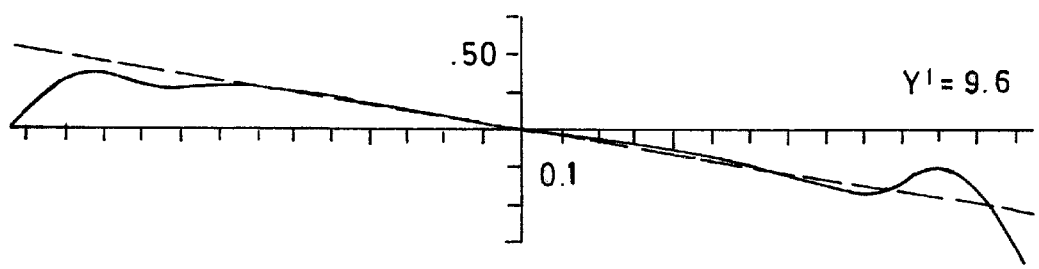
Figure 5C:
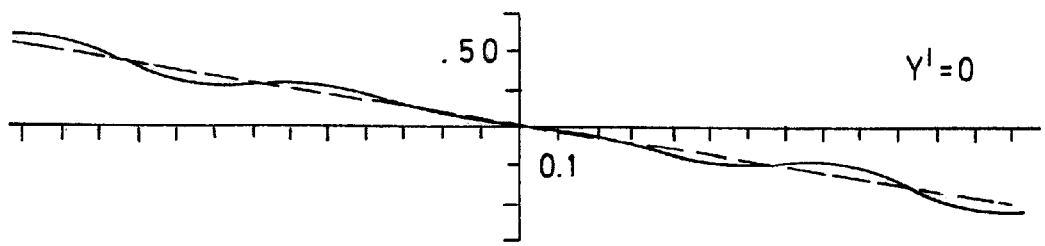

The good image error correction which is attained will be shown in more detail for the embodiment of FIG. 1. FIGS. 4a–4c show the sagittal transverse deviation DZS as a function of the half aperture angle DW for image heights of 13.8, 9.6 and 0 mm. FIGS. 5a–5c show the corresponding meridional sections DYM.

The distortion of the main beam Vhs for different image heights (in fractions of the maximum image height Y'=13.6 mm) is given in Table 4. It is at most 1.5 nm for all image heights.

Table 5 gives the deviation of the distortion $\Delta V$ of this Vhs for different settings of the numerical aperture NA and of the degree of coherence, sigma. Annular aperture illumination conditions with the values of 0.35–0.70 and 0.50–0.85 of sigma are likewise considered. The greatest value of this deviation is 4.7 nm; the values predominantly lie below 3 nm.

Altogether, the distortion is thus below 10 nm overall and with all settings, and even below 6 nm and predominantly still lower. These values are to be considered in combination with the very high NA of 0.8 of this objective. Considerably smaller distortions can be realized at smaller NA.

Thus this design exhibits very good stability to changes of the aperture NA used (stopping down) and changes of the illumination settings (sigma).

The further embodiment of FIG. 6 and Table 6 differs from the preceding embodiments mainly by a minimal variation of the real diaphragm position from 25 mm to 15 mm now. This was attained in that the curved image (diaphragm) of the pupil was partially compensated by targeted compensation of the astigmatism in tangential section. Stopping down without a change of position of the diaphragm AS can thus be embodied. The imaging scale is 1:4, and the numerical aperture is NA=0.70.

Altogether, the construction largely corresponds to the embodiment of FIG. 1. The air gap between the lenses 624 and 625 is only a little curved.

Figure 7:
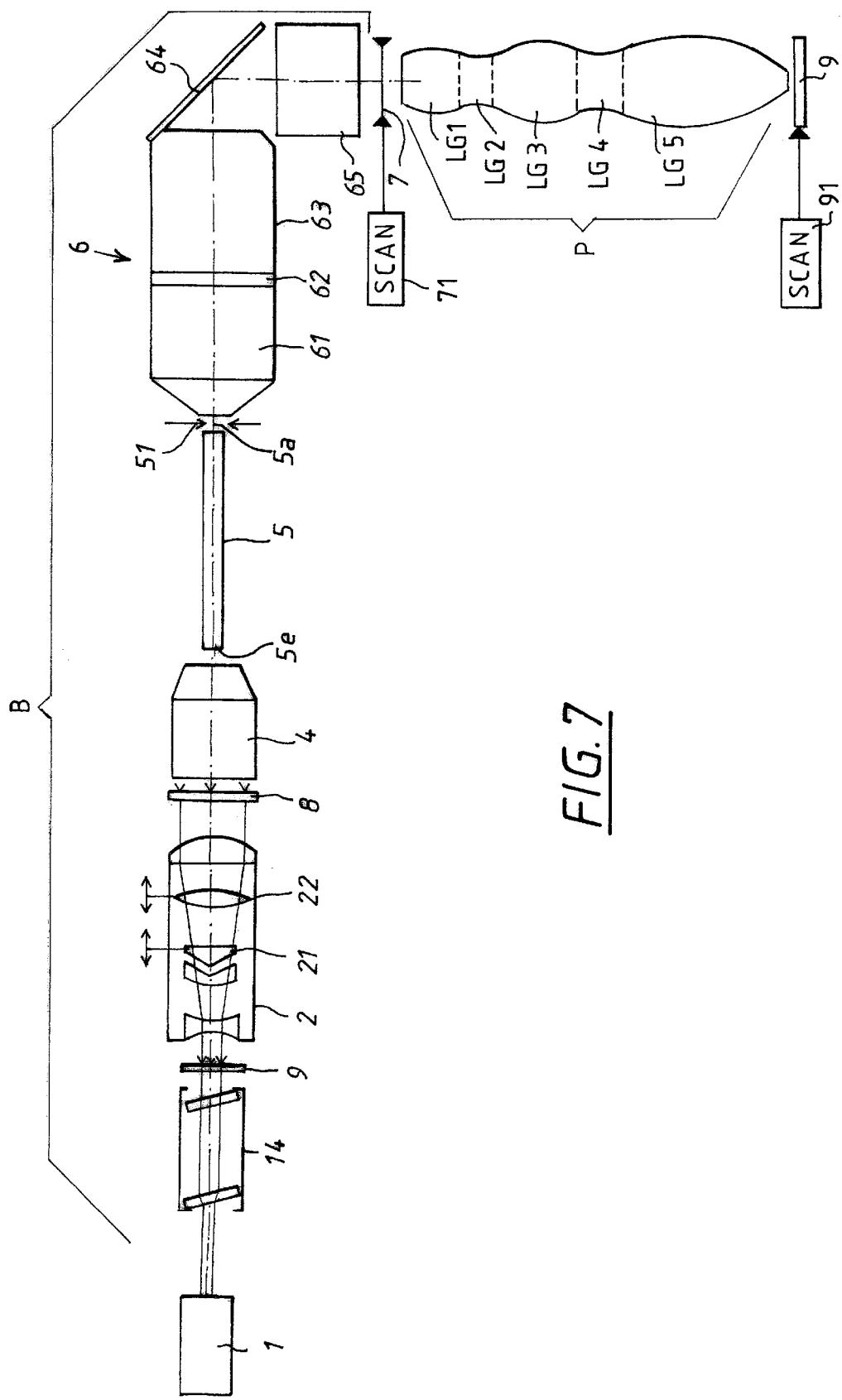
FIG. 7 shows schematically an example of a projection exposure equipment according to the invention.

FIG. 7 gives an overview of an example of a projection exposure equipment with a projection objective according to the invention. A suitable illumination system B is known, for example, from EP 0 747 772-A (U.S. Pat. application Ser. No. 08/658,605).

The laser 1 is a KrF excimer laser of wavelength 248 nm, as is usual in microlithography in the deep ultraviolet (DUV).

A beam widener 14, e.g. a mirror arrangement according to DE-A 41 24 311, serves to reduce coherence and to enlarge the beam cross section.

A first diffractive optical raster element 9 forms the object plane of an objective 2, and a second diffractive optical raster element 8 is provided in the exit pupil of the objective 2.

A coupling optical element 4 transfers the light to the entry surface 5e of a glass rod 5, which mixes and homogenizes the light by multiple internal reflections. Directly at the exit surface 5a is an intermediate field plane, in which a reticle masking system (REMA) 51, an adjustable field diaphragm, is arranged. The following REMA objective 6, with lens groups 61, 63, 65, deflecting mirror 64, and pupil plane 62, images the intermediate field plane of the reticle masking system 51 on the reticle 7.

In a wafer scanner, a narrow strip, a rectangle with an aspect ratio of 1:2 to 1:8, is illuminated on the reticle 7, and the whole structured field of a chip is serially illuminated by scanning. The illumination is to be configured extremely uniformly and sharp edged (only in the direction perpendicular to the scan direction).

The embodiment of the portions preceding the glass rod 5, in particular of the optical raster elements 8 and 9, is chosen so that the entry opening 5e is illuminated, not only as homogeneously as possible, but also with the highest possible efficiency, i.e., without appreciable light losses near the entry opening 5e.

As described in DE 44 21 053, the objective 2 is a zoom objective (movable lens 22) with integrated adjustable axicon pair 21. The focal length has a threefold elongation region, so that partially coherent illumination with the usual values of about $0.3 \leq \sigma \leq 0.9$ can be produced.

Appropriate annular aperture illuminations can in addition be set up by adjusting the axicon pair 21. Furthermore, special forms of the illumination can be produced by additional diaphragms or special pyramid form of the axicon pair 21.

The projection objective P with the lens groups LG1–LG5 is arranged between the reticle (mask) 7 and wafer 9, respectively with scanning devices 71, 91 and the known auxiliary devices.

We claim:

1. A microlithographic projection objective with a lens arrangement, comprising:
    a first lens group of positive refractive power,
    a second lens group of negative refractive power,
    a third lens group of positive refractive power,
    a fourth lens group of negative refractive power, and
    a fifth lens group of positive refractive power,
in which
    the numerical aperture on an image side is greater than approximately of 0.65,
    a system diaphragm is situated in said fifth lens group, and
    at least two lens of said fifth lens group are situated before said system diaphragm.

2. The microlithographic projection objective according to claim 1, in which said numerical aperture is greater than approximately 0.68.

3. The microlithographic projection objective according to claim 1, in which said system diaphragm is arranged between two converging lenses and is directly followed by at least one further converging lens on an image side.

4. The microlithographic projection objective according to claim 1, in which a first lens of said fifth lens group is a weakly refracting, thick meniscus, concave on an object side.

5. The microlithographic projection objective according to claim 1, in which a lens, concave on an object side, follows after said system diaphragm.

6. The microlithographic projection objective according to claim 5, in which said lens that is concave on an object side comprises a thick meniscus.

7. The microlithographic projection objective according to claim 5, in which said lens that is concave on an object side is followed, with a thin air gap, by a convergent lens.

8. The microlithographic projection objective according to claim 1, in which a pair of lenses that are concave on an object side, and are separated from each other by a thin air gap, follows said system diaphragm.

9. The microlithographic projection objective according to claim 7, in which said air gap is concave on an object side.

10. The microlithographic projection objective according to claim 1, in which distortion remains below approximately 10 nm, when stopping down as far as approximately 70% of said numerical aperture.

11. The microlithographic projection objective according to claim 10, in which said distortion remains below approximately 6 nm.

12. A microlithographic projection objective with a lens arrangement, comprising:
    a first lens group of positive refractive power,
    a second lens group of negative refractive power,
    a third lens group of positive refractive power,
    a fourth lens group of negative refractive power, and
    a fifth lens group of positive refractive power,
in which
    a system diaphragm is situated in said fifth lens group,
    at least two lenses of said fifth lens group are situated before said system diaphragm, and
    said fifth lens group comprises at least 13 lenses.

13. A microlithographic projection objective with a lens arrangement, comprising: a first lens group of positive refractive power forming a convexity of a pencil of rays,
    a second lens group of negative refractive power forming a waist of said pencil of rays,
    a third lens group of positive refractive power forming a second convexity of said pencil of rays,
    a fourth lens group of negative refractive power forming a second waist of said pencil of rays, and
    a fifth lens group of positive refractive power forming a third convexity of said pencil of rays,
wherein
    a system diaphragm situated in said fifth lens group, in a region of a lens at which said pencil of rays assumes its greatest diameter and its one neighboring lens.

14. The microlithographic projection objective according to claim 13, in which said system diaphragm is arranged between two convergent lenses of said fifth lens group.

15. The microlithographic projection objective according to claim 13, in which said second lens group includes at least two negative lenses and a positive lens.

16. The microlithographic projection objective according to claim 13, in which said first lens is concave on an object side.

17. The microlithographic projection objective according to claim 13, in which the sine of an i-angle of an edge beam (sin $i_{edge}$) at all lenses before a last lens on an object side is smaller than a numerical aperture on an object side (sin $i_{edge}$<NA).

18. A projection exposure apparatus for microlithography, comprising a light source,
    an illumination system,
    a mask holding and adjusting system,
    a projection objective according to claim 13, and
    an object holding and adjusting system.

19. The projection exposure apparatus according to claim 18, in which said lightsource comprises a DUV excimer laser.

20. A process of manufacturing microstructured components comprising the steps of
    using several microlithographic exposures with a projection exposure equipment having the features of claim 18, and
    setting different illumination or numerical aperture for different exposures.

21. A microlithographic projection objective with a lens arrangement, comprising: a first lens group of positive refractive power forming a convexity of a pencil of rays, a second lens group of negative refractive power forming a waist of said pencil of rays, a third lens group of positive refractive power forming a second convexity of said pencil of rays,
    a fourth lens group of negative refractive power forming a second waist of said pencil of rays, and
    a fifth lens group of positive refractive power forming a third convexity of said pencil of rays, wherein
a system diaphragm situated in said fifth lens group, in a region of a lens at which said pencil of rays assumes its greatest diameter and its one neighboring lens, and
the sine of an i-angle of an edge beam ($\sin i_{edge}$) at all lenses before a last lens on an object side is smaller than a numerical aperture on an object side ($\sin i_{edge} < NA$).

22. The projection exposure apparatus according to claim 21, further comprising an illuminating system that produces various kinds of illumination, and a projection objective that keeps distortion below approximately 10 nm, with various kinds of illumination.

23. The projection exposure apparatus according to claim 22, in which said distortion is below approximately 6 nm.

24. A microlithographic projection objective with a lens arrangement, comprising:
a first lens group of positive refractive power forming a convexity of a pencil of rays,
a second lens group of negative refractive power forming a waist of said pencil of rays,
a third lens group of positive refractive power forming a second convexity of said pencil of rays,
a fourth lens group of negative refractive power forming a second waist of said pencil of rays, and
a fifth lens group of positive refractive power forming a third convexity of said pencil of rays,
wherein
a system diaphragm situated in said fifth lens group, in a region of a lens at which said pencil of rays assumes it greatest diameter and its one neighboring lens, in which said first lens group comprises a first lens on an objective side, said first lens being concave on an object side.

25. A projection exposure apparatus for microlithography, comprising
a light source,
an illumination system,
a mask holding and adjusting system,
an object holding and adjusting system, and
a microlithographic projection objective with a lens arrangement, comprising:
a first lens group of positive refractive power,
a second lens group of negative refractive power,
a third lens group of positive refractive power,
a fourth lens group of negative refractive power, and
a fifth lens group of positive refractive power,
wherein
the numerical aperture on an image side is greater than approximately 0.65,
a system diaphragm is situated in said fifth lens group, and
at least two lenses of said fifth lens group are situated before said system diaphragm.

26. A microlithographic projection objective with a lens arrangement, comprising: a first lens group of positive refractive power forming a convexity of a pencil of rays,
a second lens group of negative refractive power forming a waist of said pencil of rays,
a third lens group of positive refractive power forming a second convexity of said pencil of rays,
a fourth lens group of negative refractive power forming a second waist of said pencil of rays, and
a fifth lens group of positive refractive power forming a third convexity of said pencil of rays,
wherein
a system diaphragm is situated in said fifth lens group, in a region of a lens at which said pencil of rays assumes its greatest diameter and its one neighboring lens, and
wherein in a region of said fourth lens group, exactly three negative lenses are arranged around said second waist.

27. A projection exposure apparatus for microlithography, comprising:
a light source,
an illumination system,
a mask holding and adjusting system,
an object holding and adjusting system, and
a microlithographic projection objective with a lens arrangement, comprising:
a first lens group of positive refractive power,
a second lens group of negative refractive power,
a third lens group of positive refractive power,
a fourth lens group of negative refractive power, and
a fifth lens group of positive refractive power,
wherein
a system diaphragm is situated in said fifth lens group,
at least two lenses of said fifth lens group are situated before said system diaphragm, and
said fifth lens group comprises at least 13 lenses.

28. A process of manufacturing microstructured components comprising the steps of using a plurality of microlithographic exposures with a projection exposure equipment having
a light source,
an illumination system,
a mask holding and adjusting system,
a projection objective with a lens arrangement, comprising:
a first lens group of positive refractive power forming a convexity of a pencil of rays,
a second lens group of negative refractive power forming a waist of said pencil of rays,
a third lens group of positive refractive power forming a second convexity of said pencil of rays,
a fourth lens group of negative refractive power forming a second waist of said pencil of rays, and
a fifth lens group of positive refractive power forming a third convexity of said pencil of rays,
wherein
a system diaphragm situated in said fifth lens group, in a region of a lens at which said pencil of rays assumes its greatest diameter and its one neighboring lens.

29. A process of manufacturing microstructured components comprising the steps of:
using a plurality of microlithographic exposures with a projection exposure equipment having
a microlithographic projection objective with a lens arrangement, comprising:
a first lens group of positive refractive power,
a second lens group of negative refractive power,
a third lens group of positive refractive power,
a fourth lens group of negative refractive power, and
a fifth lens group of positive refractive power,
wherein
a system diaphragm is situated in said fifth lens group,
at least two lenses of said fifth lens group are situated before said system diaphragm, and
said fifth lens group comprises at least 13 lenses, and
setting different illumination or numerical aperture for different exposures.

* * * * *